United States Patent [19]

Simon et al.

[11] 4,157,538

[45] Jun. 5, 1979

[54] CORRECTION CIRCUIT FOR A DIGITAL TO SYNCHRO/RESOLVER CONVERTER

[75] Inventors: David J. Simon, Saddle Brook, N.J.; Edward C. Costello, Scarsdale, N.Y.

[73] Assignee: The Singer Company, Little Falls, N.J.

[21] Appl. No.: 853,341

[22] Filed: Nov. 21, 1977

[51] Int. Cl.² .............................................. H03K 13/02
[52] U.S. Cl. ............................... 340/347 SY; 318/569; 318/632; 340/347 CC; 340/347 M
[58] Field of Search .... 340/347 SY, 347 M, 347 DA, 340/347 CC; 318/569, 661, 632; 364/607

[56] References Cited

U.S. PATENT DOCUMENTS

| | | | |
|---|---|---|---|
| 3,974,498 | 10/1976 | Knier | 340/347 SY X |
| 4,016,558 | 4/1977 | Bishop et al. | 340/347 M X |
| 4,097,858 | 6/1978 | Stella et al. | 340/347 SY |

Primary Examiner—Thomas J. Sloyan
Attorney, Agent, or Firm—T. W. Kennedy

[57] ABSTRACT

In a digital to synchro/resolver converter which has an intrinsic transformation ratio variation with respect to input angle greater than desired in a given application, the intrinsic variation is corrected by applying a correction to the reference voltage used in carrying out the digital to synchro conversion.

5 Claims, 2 Drawing Figures

CORRECTION CIRCUIT FOR A DIGITAL TO SYNCHRO/RESOLVER CONVERTER

BACKGROUND OF THE INVENTION

This invention relates to digital to synchro/resolver converters is general, and more particularly to an improved method of correcting the intrinsic transformation ratio variation versus input angle in such converters.

A digital to synchro/resolver converter is a device which takes an angle represented by a plurality of digital bits and converts it into two or more signals containing angular information. Typically, the signals supplied are at a frequency of 400 Hz and represent the sine and cosine of the digital input angle. If used with a resolver, these outputs are used directly. If to be used with a synchro, the sine and cosine signals are transformed, typically through what is known as a "Scott T" transformer into the three synchro signals which have phases displaced 120° from each other. Hereinafter, when referring to the converter, it will be referred to simply as a digital to synchro converter, that name also implying that it may be used as a digital to resolver converter.

Converters of this nature have been constructed using various types of approximations. Furthermore, because of the repetitive nature of the sine and cosine functions and the fact that certain portions thereof mirror each other, it is typical in such converters to generate sine and cosine values only over an octant or quadrant and to then use selection means to assign the value to either the cosine output or sine output and to give it the proper sign.

A particularly simple and reasonably accurate conversion scheme is disclosed in U.S. Pat. No. 4,072,940, issued Feb. 7, 1978 and assigned to the same assignee as the present invention. The system disclosed therein uses straight line approximations generating slopes and intersects and carrying out the necessary selection and addition thereof to generate the sine and cosine values.

As a general rule, digital to synchro converters which use approximations of this nature have a transformation ratio which is defined as $V_o \sqrt{\sin \theta^2 + \cos \theta^2}/V_r$, where $V_o$ is the output at maximum coupling and $V_r$ the input reference voltage. In a perfect converter, this ratio would be a constant. However, in typical converters using an approximation, this ratio varies as much as $\pm 7.5\%$ as the input angle changes. These variation result from variations in the term $\sqrt{\sin \theta^2 + \cos \theta^2}$ which would always be 1 in a perfect converter. The angular accuracy of the converter defined as the ratio sine $\theta/\cos \theta$ is not affected by the transformation ratio variation and is indeed independent of it. In many applications such as use in a null seeking servo loop, the variation gives only second order errors. However, there are many other applications where the transformation ratio does affect the ultimate output. A specific example is where the output of the converter is used to drive a cathode ray rube display. For example, when used in radar displays, if the transformation ratio is constant, a perfect circle will be displayed as the input angle is swept through 360°. If the transformation ratio varies by $\pm 7.5\%$, the display will be grossly distorted, i.e., it will be in the shape of a trapezoid. Since the locus of the circle is the information being transmitted in a radar display, any distortion becomes significant. Empirical data indicates that although variations of $\pm 0.25\%$ can still be objectionable, variations within $\pm 0.1\%$ cause no discernible distortion.

Methods have been developed for generating improved transformation ratio variation. For example, if the sin $\theta$ information and cos $\theta$ information are accurately generated on an absolute basis, the variation will remain very small. However, the means to generate this information on an absolute basis is typically both cumbersome and expensive. One way is through the use of tapped transformers. However, this is done at the expense of size, weight, cost and reliability. This can also be done by generating a large number of linear segments. In order to obtain the required accuracy of $\pm 0.1\%$, the linear segments could not exceed 5.625° in length. However, making the linear segments shorter requires complex switching and resistor networks making the system more costly and complex.

The system disclosed in the aforementioned patent, which uses a linear approximation having segments 11.25°, has a transformation ratio variation versus input angle which is $\pm 0.25\%$.

Thus, there is a need for a manner of improving this transformation ratio in a converter of this general nature so as to reduce the transformation ratio variation to $\pm 0.1\%$ so as to permit application of a converter of this nature as a cathode ray tube drive.

SUMMARY OF THE INVENTION

The present invention provides a manner of carrying out such a correction to permit use of this type of converter in an application which requires a smaller transformation ratio variation.

An examination of the approximation of the aforementioned U.S. Pat. No. 4,072,940 shows that there is a specific cyclical nature to the transformation ratio variation regardless of which segment, from 0° to 45°, is being implemented. Moreover, there is also symmetry with respect to the midpoint of each segment. It is thought that examination of other conversion schemes would show that they too have similar characteristics with respect to the symmetry of the transformation ratio variation. Thus, although the remainder of the discussion will deal with the correction of the specific converter disclosed in the aforementioned application, the method and apparatus of the present invention are thought to be generally applicable to other converters which operate on similar principles.

The present invention provides the correction of the transformation ratio variation versus input angle by a variation in the reference voltage which is supplied to the digital to synchro converter. Based on the known variation of the converter, the reference voltage is adusted so that the ratio, described above, more nearly approaches 1. This is accomplished using an eight segment correction circuit implemented using readily available and low cost components. More specifically, the uncorrected reference voltage is provided as an input to each of a plurality of eight resistors which have their other ends coupled to the inputs of a multiplexer. The various inputs of the multiplexer are switched to its output in response to the $2^6$-$2^9$ bits which represent a change of angle over 11.25°. This angular segment is divided effectively into sixteen sections. Because of the symmetry about the center point of the segment, only eight correction resistors are required.

The specific embodiment illustrated is one in which the resistors, switches and logic are used to decrease the amplifier gain so as to be inversely proportional to the corrections required. However, it would also be possible to use a scheme in which the gain of the amplifier was increased.

DETAILED DESCRIPTION OF THE INVENTION

Figure 1:
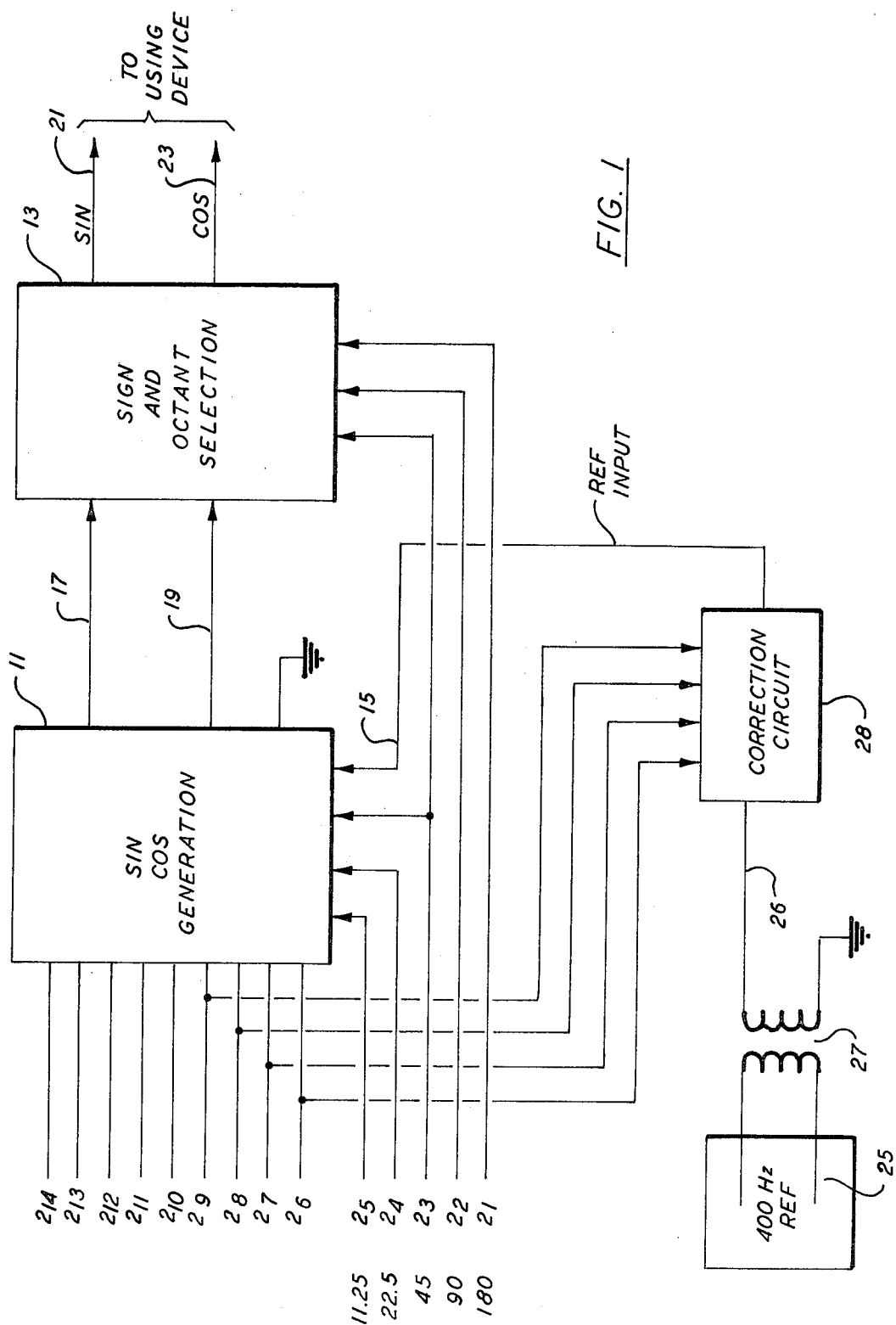
FIG. 1 is a block diagram showing how the correction circuit of the present invention is used with a digital to synchro converter.

FIG. 1 illustrates the use of the correction circuit of the present invention with a digital to synchro converter such as the type of converter disclosed in the aforementioned patent. The converter consists basically of two parts, a sine/cosine generation module 11 and a sign and octant selection module 13. The converter illustrated is one of 14 bit resolution. The most significant or $2^1$ bit represents 180° which with each bit thereafter having a value one-half the previous bit, e.g., the $2^2$ bit corresponds to 90°, the $2^3$ bit to 45° etc. The $2^3$ through $2^{14}$ bits are inputs to the sine/cosine generator. The sine/cosine generator also has an input on line 15 which is the reference voltage, typically a 400 Hz a-c signal. The converter uses this digital information to generate 400 Hz sine and cosine outputs on lines 17 and 19 respectively. The output signals at 400 Hz will have a magnitude corresponding to the sine and cosine of the digital input angle. Because both the sine and cosine wave forms are identical, but displaced in phase from each other and because of the symmetry in the wave forms themselves, the sine/ cosine generator 11 only has to generate information over one octant. For example, consider an angle of 30° in the first octant. It is necessary to generate a sine value of relative value 0.5 and a cosine value of relative value 0.866. In the second octant as the angle reaches 60°, the sine value required is 0.866 and the cosine value 0.5. Thus, if the same values are generated, it is only necessary to switch the sine and cosine. This, in effect, is what is done in the sine/cosine generator 11. It will provide the same outputs on lines 17 and 19 for an angle of 30° and for an angle of 60°. This is accomplished by using the $2^3$ bit as a complementing bit. This makes the sine/cosine generator see essentially the same input for both of these angles, for example. The $2^3$ bit then is also provided to the a sine and octant selection module where when in the first octant, the inputs on lines 17 and 19 are provided directly to the outputs on lines 21 and 23, but when in the second octant, for example, the input on line 17 is coupled to the output on line 23 and the input on line 19 to the output on line 21. Furthermore, the values of sine and cosine from quadrant to quadrant are the same, only the signs are changed. Thus, the sign and octant selection module 13 has as inputs the 180° and 90° bit so as to carry out inversions where necessary to give the sine and cosine their proper signs. Naturally, since the sine/cosine generator 11 only generates over one octant, the transformation ratio error will be the same throughout the conversion.

Furthermore, it has been discovered that in this approximation there is a specific cyclical nature to the transformation ratio variation regardless of which of the 11.25° segments are being used and that there is moreover, a symmetry with respect to the midpoint of each segment. This is illustrated by Table I which tabulates the input angle transformation ratio and transformation ratio variation. It can be seen that the errors are the same over each 11.25° segment. The necessary corrections within each segment are given by Table II along with the maximum error resulting from this correction. The maximum error is 0.0565% with these corrections, well within the established tolerance.

TABLE I.

| Run Angle | T.R. | T.R. Var. |
|---|---|---|
| 0 | 1 | −5.0931703E-11 |
| .703125 | .9988735 | −1.126498E-03 |
| 1.40625 | .99789618 | −2.1038248E-03 |
| 2.8125 | .99639072 | −3.6092764E-03 |
| 3.515625 | .99586328 | −4.1367222E-03 |
| 4.21875 | .99548636 | −4.5136402E-03 |
| 4.921875 | .99526014 | −4.7398596E-03 |
| 5.625 | .99518472 | −4.8152775E-03 |
| 6.328125 | .99526014 | −4.7398596E-03 |
| 7.03125 | .99548636 | −4.5136402E-03 |
| 7.734375 | .99586328 | −4.1367222E-03 |
| 8.4375 | .99639072 | −3.6092764E-03 |
| 8.4375 | .99639072 | −3.6092764E-03 |
| 9.140625 | .99706846 | −2.9315419E-03 |
| 10.546875 | .9988735 | −1.126498E-03 |
| 11.25 | 1 | −5.0931703E-11 |
| 11.953125 | .9988735 | −1.126498E-03 |
| 12.65625 | .99789618 | −2.1038248E-03 |
| 13.359375 | .99706846 | −2.9315419E-03 |
| 14.0625 | .99639072 | −3.6092764E-03 |
| 14.765625 | .99586328 | −4.1367222E-03 |
| 15.46875 | .99548636 | −4.5136402E-03 |
| 16.171875 | .99526014 | −4.73985963E-03 |
| 16.875 | .99518472 | −4.8152775E-03 |
| 17.578125 | .99526014 | −4.7398596E-03 |
| 18.28125 | .99548636 | −4.5136402E-03 |
| 18.984375 | .99586328 | −4.1367222E-03 |
| 19.6875 | .99639072 | −3.6092764E-03 |
| 20.390625 | .99706846 | −2.9315419E-03 |
| 21.09375 | .99789618 | −2.1038248E-03 |
| 21.796875 | .9988735 | −1.126498E-03 |
| 22.5 | 1 | 5.8207661E-11 |
| 23.203125 | .9988735 | −1.126498E-03 |
| 23.90625 | .99789618 | −2.1038248E-03 |
| 24.609375 | .99706846 | −2.9315419E-03 |
| 25.3125 | .99639072 | −3.6092764E-03 |
| 26.015625 | .99586328 | −4.1367222E-03 |
| 26.71875 | .99548636 | −4.5136402E-03 |
| 27.421875 | .99526014 | −4.7398596E-03 |
| 28.125 | .99518472 | −4.8152775E-03 |
| 28.828125 | .99526014 | −4.7398596E-03 |
| 29.53125 | .99548636 | −4.5136402E-03 |
| 30.234375 | .99586328 | −4.1367222E-03 |
| 30.9375 | .99639072 | −3.6092764E-03 |
| 31.640625 | .99706846 | −2.9315419E-03 |
| 32.34375 | .99789618 | −2.1038248E-03 |
| 33.046875 | .9988735 | −1.126498E-03 |
| 33.75 | 1 | 5.8207661E-11 |
| 34.453125 | .9988735 | −1.126498E-03 |
| 35.15625 | .99789618 | −2.1038248E-03 |
| 35.859375 | .99706846 | −2.9315419E-03 |
| 36.5625 | .99639072 | −3.6092764E-03 |
| 37.265625 | .99586328 | −4.1367222E-03 |
| 37.96875 | .99548636 | −4.5136402E-03 |
| 38.671875 | .99526014 | −4.7398596E-03 |
| 39.375 | .99518472 | −4.8152775E-03 |
| 40.078125 | .99516014 | −4.7398596E-03 |
| 40.7825 | .99548636 | −4.5136402E-03 |
| 41.484375 | .99586328 | −4.1367222E-03 |
| 42.1875 | .99639072 | −3.6092764E-03 |
| 42.890625 | .99706846 | −2.9315419E-03 |
| 43.59375 | .99789618 | −2.1038248E-03 |
| 44.296875 | .9988735 | −1.126498E-03 |

TABLE II

| SEGMENT SECTION | | REQUIRED CORRECTION | MAXIMUM ERROR |
|---|---|---|---|
| 0 | 1/16 | +.0565% | .0565% |
| 1/16 | 1/8 | +.1016% | .0489% |
| 1/8 | 3/16 | +.2517% | .0413% |
| 3/16 | 1/4 | +.3271% | .0339% |
| 1/4 | 5/16 | +.3873% | .0264% |

TABLE II-continued

| SEGMENT SECTION | | | REQUIRED CORRECTION | MAXIMUM ERROR |
|---|---|---|---|---|
| 5/16 | | 3/8 | .4326% | .0189% |
| 3/8 | | 7/16 | +.4627% | .0113% |
| 7/16 | | 1/2 | +.4778% | .0038% |
| 1/2 | | 9/16 | +.4778% | .0038% |
| 9/16 | ⟷ | 5/8 | +.4627% | ±.0113% |
| 5/8 | ⟷ | 11/16 | +.4326% | ±.0189% |
| 11/16 | ⟷ | 3/4 | +.3873% | ±.0264% |
| 3/4 | ⟷ | 13/16 | +.3271% | ±.0339% |
| 13/16 | ⟷ | 7/8 | +.2517% | ±.0413% |
| 7/8 | ⟷ | 15/16 | +.1616% | ±.0489% |
| 15/16 | ⟷ | 1 | +.0565% | ±.0565% |

Since the transformation ratio is defined as $V_o\sqrt{\sin\theta^2 + \cos\theta^2}/V_r$, where $V_o$ is the output at maximum coupling and $V_r$ the input reference voltage, these corrections can be implemented by changing the reference voltage input $V_r$ by the desired amounts. This can be done in a variety of ways using various grades of components in order to most nearly approach the minimum inherent error of ±0.056%. One way of doing this would be with a conventional operational amplifier with appropriate resistors, switches and logic to increase the gain of the amplifier such as to match the required corrections of Table II. Another way is to use a conventional operational amplifier, resistor, switches and logic to decrease the amplifier gain in a manner inversely proportional to the listed corrections of Table II. This is the embodiment chosen which will be described in more detail below. This, with reference to FIG. 1 again, the reference input on line 15 which would normally be obtained for a 400 Hz reference source 25, coupled through an isolation transformer 27, now has interposed a correction circuit 29 which receives as inputs the $2^6$-$2^9$ bits, the bits representing an 11.25° segment. This circuit applies a correction approximating that of Table II to the reference input thereby resulting in a transformation ratio which more nearly approaches 1 and which has an error less than 0.1% making the outputs on lines 21 and 23 useable in a device such as a cathode ray tube display.

Figure 2:
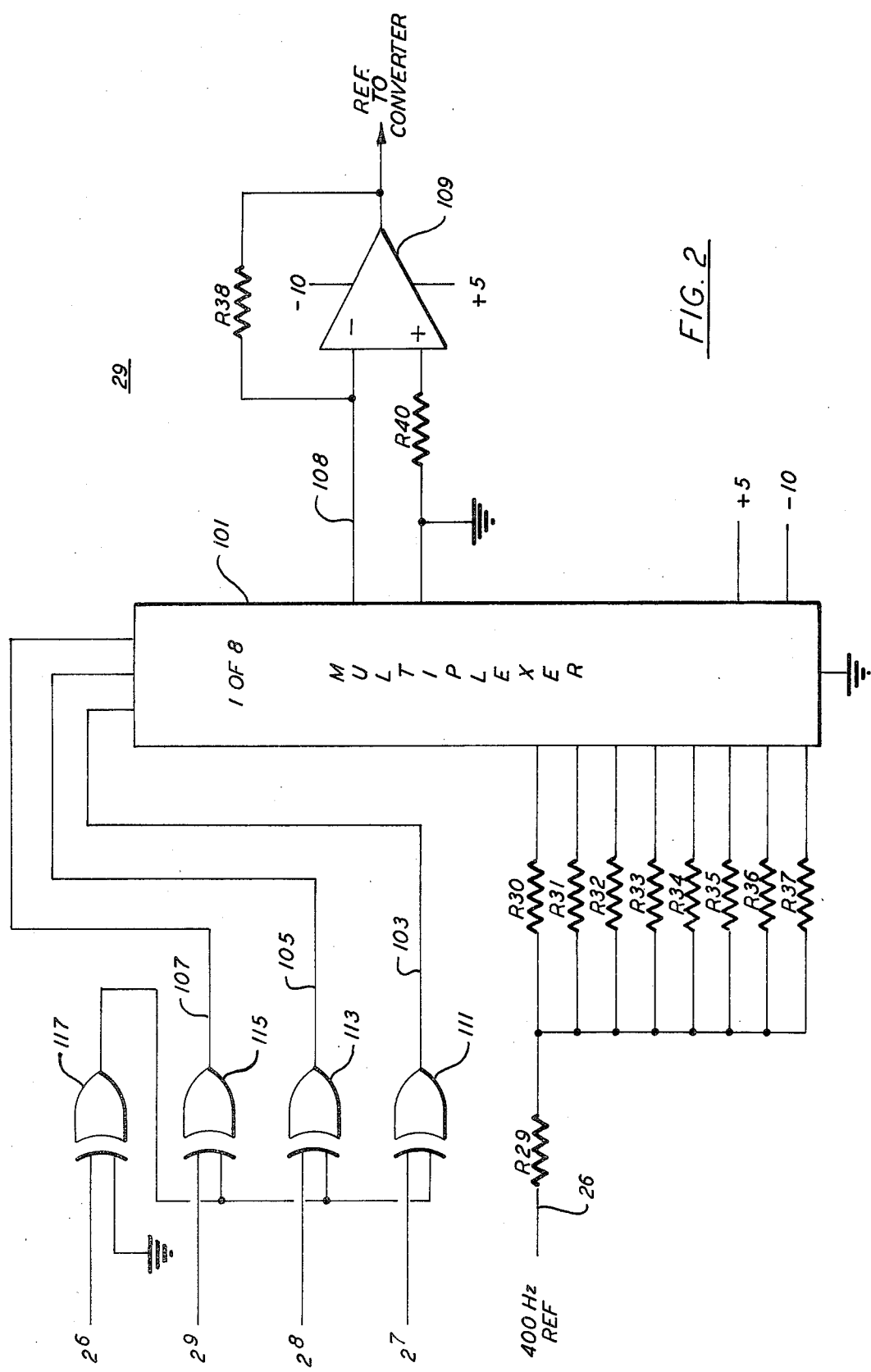
FIG. 2 is a circuit-logic diagram of the correction circuit of FIG. 1.

FIG. 2 illustrates the correction circuit 29 of FIG. 1. It should be noted that the correction circuit results in a 180° phase reversal because it utilizes an amplifier. Thus, the wiring of the transformer 27 must be opposite to that which is normally used with the converter.

As illustrated, the 400 Hz reference voltage on line 26 is coupled through a resistor R29 to one side of each of 8 resistors designated R30-R37 respectively. The other sides of these resistors are coupled to the inputs of an analog multiplexer 101 which has conventional d-c and ground inputs as indicated and receives logic inputs on lines 103, 105 and 107. The multiplexer is commonly available, for example, from RCA under part number CD-4051BF. The multiplexer, in accordance with the logic inputs 103-107, selects one of the resistors R30-R37 and couples it t the output line 108. This output is an input to the inverting input of an operational amplifier 109 having negative feedback through a resistor R38. The non-inverting input of the amplifier is coupled to ground through a resistor R40. Resistor R38 has a nominal value of 100 K ohms, R40 a value of 51 K ohms. Resistor R29 has a value of 100 K ohms and resistors R30-R37, the respective values of 510, 430, 330, 270, 200, 150, 120 and 100 ohms. If necessary, another resistor can be placed in series with resistor R38 when the apparatus is constructed to carry out any necessary trimming. Each of the resistors changes the forward gain of the amplifier 109 by an amount selected to be proportional to the required correction. Moreover, the resistors need only be commonly available resistors with tolerances of ±5% in order to implement the correction with the desired overall accuracy. The operational amplifier gain is also not critical since any gain error, per se, is not objectionable since it does not change with respect to the input angle, still yielding a constant locus on a CRT.

The digital inputs to the multiplexer on lines 103, 105 and 107 are obtained respectively from the outputs of exclusive OR gates 111, 113, and 115. Each of the exclusive OR gates has as one input the output of another exclusive OR gate 117. Exclusive OR gate 117 has its one input grounded and has as its second input the $2^6$ bit. The output of gate 117 is one input to each of the exclusive OR gates 11, 113, and 115. These have as their respective second inputs the $2^7$, $2^8$ and $2^9$ bits. The truth table for these circuits is given in Table III which also indicates the selected resistor and the nominal gain change. Note that the nominal gain change follows directly from the resistance ratios involved.

TABLE III

| Input Angle | | | | Input to 101 | | | Selected Resistor | Nominal Gain Change |
|---|---|---|---|---|---|---|---|---|
| $2^6$ | $2^7$ | $2^8$ | $2^9$ | 103 | 105 | 107 | | |
| 0 | 0 | 0 | 0 | 0 | 0 | 0 | R30 | −.51% |
| 0 | 0 | 0 | 1 | 0 | 0 | 1 | R31 | −.43% |
| 0 | 0 | 1 | 0 | 0 | 1 | 0 | R32 | −.33% |
| 0 | 0 | 1 | 1 | 0 | 1 | 1 | R33 | −.27% |
| 0 | 1 | 0 | 0 | 1 | 0 | 0 | R34 | −.20% |
| 0 | 1 | 0 | 1 | 1 | 0 | 1 | R35 | −.15% |
| 0 | 1 | 1 | 0 | 1 | 1 | 0 | R36 | −.12% |
| 0 | 1 | 1 | 1 | 1 | 1 | 1 | R37 | −.10% |
| 1 | 0 | 0 | 0 | 1 | 1 | 1 | R37 | −.10% |
| 1 | 0 | 0 | 1 | 1 | 1 | 0 | R36 | −.12% |
| 1 | 0 | 1 | 0 | 1 | 0 | 1 | R35 | −.15% |
| 1 | 0 | 1 | 1 | 1 | 0 | 0 | R34 | −.20% |
| 1 | 1 | 0 | 0 | 0 | 1 | 1 | R33 | −.27% |
| 1 | 1 | 0 | 1 | 0 | 1 | 0 | R32 | −.33% |
| 1 | 1 | 1 | 0 | 0 | 0 | 1 | R31 | −.43% |
| 1 | 1 | 1 | 1 | 0 | 0 | 0 | R30 | −.51% |

The nominal change in gain, as desired, is the inverse of the gain change required by Table II. This table also shows that the corrections are dependent only on the 6th, 7th, 8th and 9th most significant bits. The eight segments of correction, because of the symmetry about a segment and the manner in which the $2^6$ bit is used, results in a correction over sixteen segments.

Table IV lists the nominal gain change of the amplifier 109 versus the 7th, 8th and 9th most significant bits. As noted above, since the nominal gain error is not objectionable, the nominal gain changes can be normalized with respect to any one gain setting, in this case, the last. Also listed is the desired gain change and the peak error of each segment which includes the errors listed in Table II. Additional worse case errors due to a maximum resistance tolerance error of 5% still limits the absolute worse case error to 0.067% + 0.5 × 0.41 = 0.088% well within the desired limit of 0.1%.

TABLE IV

| $2^7$ | $2^8$ | $2^9$ | Nominal Gain Change | Normalized Gain Change | Desired Gain Change | Peak Error |
|---|---|---|---|---|---|---|
| 0 | 0 | 0 | −.51% | −.41% | −.42% | .067% |
| 0 | 0 | 1 | −.43% | −.33% | −.32% | .05% |
| 0 | 1 | 0 | −.33% | −.23% | −.23% | .041% |
| 0 | 1 | 1 | −.27% | −.17% | −.15% | .054% |
| 1 | 0 | 0 | −.20% | −.10% | −.09% | .036% |
| 1 | 0 | 1 | −.15% | −.05% | −.045% | .024% |

TABLE IV-continued

| $2^7$ | $2^8$ | $2^9$ | Nominal Gain Change | Normalized Gain Change | Desired Gain Change | Peak Error |
|---|---|---|---|---|---|---|
| 1 | 1 | 0 | −.12% | −.02% | −.015% | .016% |
| 1 | 1 | 1 | −.10% | 0 | 0 | .004% |

It should further be noted that the listed values of resistors were selected to both meet the requirements of the desired correction and to be standard values of MIL-style carbon composition 5% resistors, i.e., RCR 05 and RCR 07 styles. The nominal values were also selected so that non-critical switches could be used in the multiplexer. For example, the multiplexer defined above has a nominal resistance in each channel of 125 ohms with a worst case of 280 ohms. However, each channel is typically matched to each other channel to within 10 ohms. The nominal value change would cause a nominal constant gain change, which is not objectionable, and the maximum change of 10 ohms per channel is not significant in the error budget.

Various modifications of the present invention are possible. For example, in the converter under consideration, which has a cyclical error from segment to segment, increased accuracy can be obtained by making use of the stated symmetries and using more than eight segments of correction.

In general terms, in the present example where the segment is 11.25° and the variation symmetrical about the center thereof, this segment is divided into $2^n$ increments where, in the specific example given n is equal to 4. Because of the symmetry, the multiplexer need only have $2^{n-1}$ inputs to select out of $2^{n-1}$ or eight correction resistors. Thus, actually the segment over which correction is carried out is a segment of 5.625°. In general terms, it can be said that where the variation is cyclical over a segment of $x°$ where the digital representation of x at the input is the $2^m$ bit, the most significant bit which must be used as an input to the multiplexer is the $2^{m-1}$ bit. Thus, in the specific example of FIG. 2, the $2^5$ bit represents 11.25° and thus, the $2^6$ bit would be the most significant bit used. However, because the correction is really only done over 5.625°, the most significant bit necessary to generate specific values is the $2^7$ bit. However, as the tables show, after going through the first half of the 11.25°, the function must be complemented. For that reason, in the embodiment of FIG. 2, the $2^6$ bit is used to complement the output of the gates 111, 113 and 115.

Thus to apply the method and apparatus of the present invention to any converter requires first determining the error over one segment. If the bit representing the angular subtense of the segment is designated as the $2^m$ bit, then the most significant bit into the multiplexer will be the $2^{m+1}$ bit. The number of additional bits will be determined by the resolution desired in correcting the error and this number of bits is designated as n. Since the error is symmetrical about the mid-point of the angular segment, the multiplexer must be capable of accepting as binary inputs the n bits and must have $2^{n-1}$ signal inputs for the coupling of the resistors. The $2^{m+1}$ bit is then only used for complementing purposes, i.e., for complementing the $2^{m-1+n-1}$ bits. Thus, in the example of FIG. 2, m is equal to 5, $m+1=6$, n is equal to 4, $2^n=16$ (the number of increments). However, because of the symmetry, only $n-1$ or 3 inputs to the multiplexer are necessary resulting in $2^3$ or eight resistors. $2^{m+1+n-1}$ is equal to $2^9$. This is the least significant bit used and thus, the $2^6$ through the $2^9$ bits are used. However, the $2^6$ bit, i.e., the $2^{m+1}$ bit is only used to complement the other three bits over the second half of the angular segment of 11.25°.

It should also be noted that intrinsic to the correction of the transformation ratio variation versus input angle is the correction of the sin $\theta$ and cos $\theta$ information, on an absolute basis, to approximately ±1% as a function of full scale accuracy.

We claim:

1. Apparatus for correcting the transformation ratio variation versus input angle in a digital to synchro converter which has as inputs a digital angle and a reference voltage and which provides outputs corresponding to the sine and cosine of the input angle, said converter having an error which is of a cyclical and repetitive nature over a predetermined length of angular segment, said error also symmetrical about the midpoint thereof, comprising:
   (a) a multiplexer having a plurality of signal inputs, a group of binary switching inputs and a single signal output, the multiplexer responsive to switch one of its signal inputs to its signal output as determined by the bit pattern at its binary inputs;
   (b) a plurality of resistors having one end coupled to the respective signal inputs of said multiplexer and their other end coupled to the source of reference voltage for the converter;
   (c) an operational amplifier having its inverting input coupled to the signal output of said multiplexer, said amplifier having a resistor in its negative feed path, the output of said amplifier coupled as the reference input to said converter, the ratio between said input resistors and feedback resistor being such as to provide a correction to the reference voltage for each of a plurality of increments of the digital input angle;
   (d) said plurality of resistors coupled to said reference voltage source through a common resistor having a nominal value equal to the feedback resistor of said amplifier whereby said plurality of resistors each will have an effective resistance equal to their own resistance plus that of said common resistance which is in series therewith; and
   (e) means coupling said digital input angle signal to the binary inputs of said multiplexer adapted to couple to the binary inputs of said multiplexer the digital bit having a value corresponding to one half the angular segment plus a plurality of less significant bits thereafter in dependence on the angular segment with which each resistor is associated.

2. Apparatus according to claim 1 wherein said converter is one which carries out an approximation using straight line segment sub-tending $x°$, the bit representing $x°$ being $2^m$, and wherein the error is cyclical for each $x°$ and symmetrical about the center thereof and wherein said $x°$ segment is to be corrected over $2^n$ increments, the number of resistors being provided being equal to $2^{n-1}$, said multiplexer thereby requiring $2^{n-1}$ inputs to select individual ones of said resistors and wherein said means coupling comprise means to couple the $2^{m+2}$ through the $2^{m+2+n-1}$ bits to said multiplexer over the first half of said $x°$ segment and to couple the complement thereof to said multiplexer over the second half of said segment.

3. Apparatus according to claim 2 wherein said means to couple comprise a plurality of n−1 exclusive OR gates having as respective inputs the $2^{m+2}$ through $2^{m+2+n-2}$ bits of the digital input angle, each of said gates providing one of the binary inputs to said multiplexer, said gates each having as a second input the $2^{m+1}$ bit.

4. Apparatus according to claim 3 wherein said $2^{m+1}$ bit is coupled into said exclusive OR gates through an additional exclusive OR gate having its second input grounded.

5. Apparatus according to claim 3 wherein said segment is 11.25°, $m=5$, $2^{m+2}=2^7$, $n=4$, $2^{m+2+n-2}=2^9$ and $2^{m+1}=2^6$ whereby the $2^6$ through $2^9$ bits are used.

* * * * *